(12) United States Patent
Fukano

(10) Patent No.: US 10,997,344 B2
(45) Date of Patent: May 4, 2021

(54) ECU SIMULATION DEVICE

(71) Applicant: HITACHI AUTOMOTIVE SYSTEMS, LTD., Hitachinaka (JP)

(72) Inventor: Yoshinobu Fukano, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 428 days.

(21) Appl. No.: 16/300,080

(22) PCT Filed: Jun. 14, 2017

(86) PCT No.: PCT/JP2017/021908
§ 371 (c)(1),
(2) Date: Nov. 9, 2018

(87) PCT Pub. No.: WO2018/003495
PCT Pub. Date: Jan. 4, 2018

(65) Prior Publication Data
US 2019/0147131 A1    May 16, 2019

(30) Foreign Application Priority Data

Jun. 27, 2016  (JP) .............................. JP2016-126382

(51) Int. Cl.
G06F 30/36     (2020.01)
G06F 30/367    (2020.01)
G06F 11/26     (2006.01)
G06F 30/00     (2020.01)
G06F 11/36     (2006.01)
B60R 16/023    (2006.01)

(52) U.S. Cl.
CPC .......... *G06F 30/367* (2020.01); *G06F 11/261* (2013.01); *G06F 11/3664* (2013.01); *G06F 11/3684* (2013.01); *G06F 30/00* (2020.01); *B60R 16/0231* (2013.01)

(58) Field of Classification Search
None
See application file for complete search history.

(56) References Cited

U.S. PATENT DOCUMENTS 3,702,011 A * 10/1972 Armstrong .............. G06F 30/33
                                                    714/33
6,205,567 B1 * 3/2001 Maruyama ............ G06F 11/261
                                                    703/13

FOREIGN PATENT DOCUMENTS

JP       07-334385 A     12/1995
JP    2004-038420 A      2/2004
(Continued)

OTHER PUBLICATIONS

International Search Report, PCT/JP2017/021908, dated Sep. 12, 2017, 1 pg.
(Continued)

*Primary Examiner* — Craig C Dorais
(74) *Attorney, Agent, or Firm* — Volpe Koenig

(57) ABSTRACT

The purpose of the present invention is to decrease the time required to create fault injection test data when performing an ECU simulation test. An ECU simulation device according to the present invention is provided with a database in which fault modes are defined for each type of circuit element, reads out, from the database, fault modes for each circuit element provided in an ECU, and generates a test pattern for each of the fault modes.

6 Claims, 6 Drawing Sheets

(56) References Cited

FOREIGN PATENT DOCUMENTS

| | | |
|---|---|---|
| JP | 2014-203314 A | 10/2014 |
| JP | 2015-026184 A | 2/2015 |

OTHER PUBLICATIONS

Japanese Office Action dated Mar. 19, 2019 for the Japanese Patent Application No. 2018-525029.

* cited by examiner (a)　　　　　　　　　　　　(b)

ECU SIMULATION DEVICE

TECHNICAL FIELD

The present invention relates to a technique of simulating operation of an electronic control unit.

BACKGROUND ART

The number of electronized control techniques relating to operation and movement of an automobile tends to be increased year after year. Several tens of in-vehicle electronic control units (ECUs) have become mounted in one automobile, and size of the entire software (hereinafter referred to as control software) mounted on the ECUs has reached one million to ten million lines (in a source code mainly written in C language).

While a development scale of the control software is increased as described above, there is demand for shortening a development period of the control software. For this reason, maintaining and improving quality of the control software in short-term development have been large problems for a manufacturer and a supplier of automobiles. In particular, design relating to safety is required to be compliant with the standard of ISO26262.

In Automotive Safety Integrity Level (ASIL) defined by ISO26262, it is strongly recommended that verification by fault injection be performed at shipment of products defined by ASIL-C or ASIL-D. The purpose of this is to provide evidence of verifying no infringement on safety with respect to a fault mode expected in a use case when an ECU product is released to the market. As described above, demand for safety design of an in-vehicle control unit is at a high level.

The ISO26262 standard recommends use of a simulation technique in the verification. In view of the above, in a recent technical trend, a technique that models an entire system including an ECU and verifies the control software and fault injection by simulation starts to be applied to mass production development.

PTL 1 below describes the technique of "building a fault circuit model for performing a fault simulation based on fault element information, performing simulation of a non-fault circuit model, extracting a state value of each terminal and element of the non-fault circuit model at the time of fault injection from a result of the simulation, estimating a state value of each terminal and element of the fault circuit model based on the extracted state value, and performing a fault circuit simulation from a fault injection time by using the estimated state value as an initial value of the fault circuit model" as a technique whose object is "to shorten a simulation execution time period of a fault simulation performed for an electric fault in a circuit simulation for the purpose of FMEA of a circuit including an analog element" (refer to the abstract).

CITATION LIST

Patent Literature

PTL 1: JP 2015-026184 A

SUMMARY OF INVENTION

Technical Problem

In a simulation conventionally performed like the one described in PTL 1, a test engineer creates each piece of fault injection test data manually, and a test engineer also creates an execution result of the simulation manually. For this reason, a tremendous period of operation time tends to be required from creation of test data to review of a test result and pass/failure determination.

The present invention is made in view of the above problem, and the purpose of the present invention is to decrease the time required to create fault injection test data when performing an ECU simulation test.

Solution to Problem

An ECU simulation device according to the present invention is provided with a database in which fault modes are defined for each type of a circuit element, reads out, from the database, fault modes for each circuit element provided in an ECU, and generates a test pattern for each of the fault modes.

Advantageous Effects of Invention

According to an ECU simulation device according to the present invention, an operation time period required for fault injection verification work can be shortened. In this manner, lowering in quality of an ECU can be prevented even with a short development period. Further, comprehensive verification of a fault mode can be performed easily for all circuit elements, which contributes to improvement in reliability of an ECU.

DESCRIPTION OF EMBODIMENTS

First Embodiment

Figure 1:
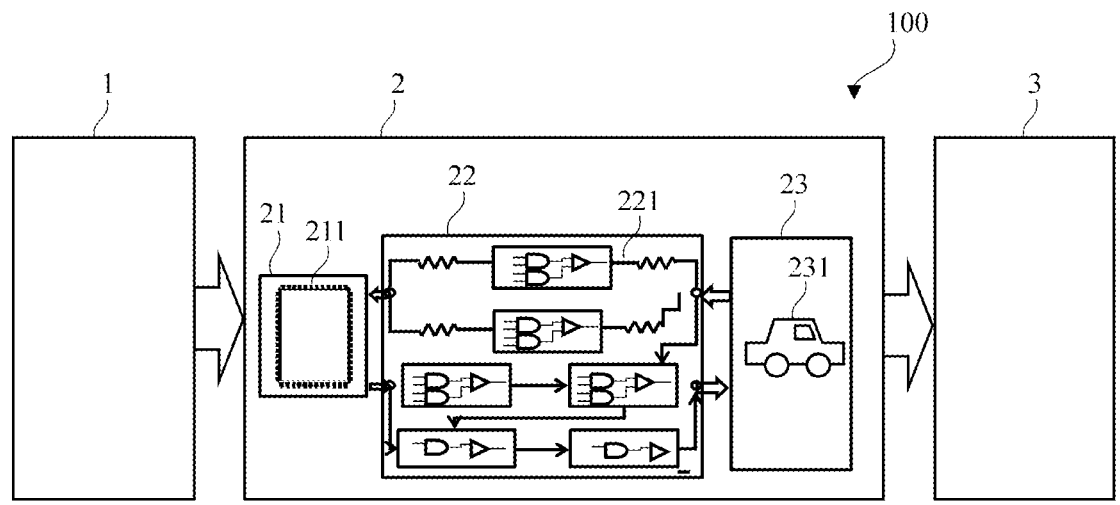
FIG. 1 is an entire configuration diagram of an ECU simulation device 100 according to a first embodiment.

FIG. 1 is an entire configuration diagram of an ECU simulation device 100 according to a first embodiment of the present invention. The ECU simulation device 100 performs a simulation test by simulating a circuit configuration and operation processing of an ECU. The ECU simulation device 100 includes a test data generation section 1, an ECU simulator 2, and a test report generation section 3.

The test data generation section 1, the ECU simulator 2, the test report generation section 3, and function parts provided internally in these sections can be mounted by using hardware, such as a circuit device, that implements functions of the sections, or can be mounted by an arithmetic unit, such as a central processing unit (CPU), executing software that implements functions similar to the above.

Data held by the function parts can be stored in a storage device, such as a hard disk drive.

The test data generation section 1 generates a test pattern to be provided to the ECU simulator 2. The test pattern is data instructing that a fault is assumed to be generated on a circuit element included in an ECU. The test data generation section 1 will be described in detail later.

The ECU simulator 2 simulates a circuit configuration and operation processing of an ECU. The ECU simulator 2 includes a microcomputer simulator 21, an ECU circuit simulator 22, and a control target simulator 23.

A microcomputer model 211 describing a behavior of a microcomputer used by an actual ECU is incorporated in the inside of the microcomputer simulator 21. The microcomputer model 211 is a model obtained by converting a source code describing a behavior of a microcomputer in a high-level language, such as C language, to a binary format that can be executed by the microcomputer simulator 21. The microcomputer simulator 21 can load and execute the microcomputer model 211 in a file format that is the same as one used for the control software mounted on an actual ECU.

An ECU circuit model 221 describing a behavior of a driver circuit, a sensor circuit, and the like mounted on an actual ECU is incorporated in the inside of the ECU circuit simulator 22. A control target model 231 describing a behavior of steering, a brake, a suspension, a vehicle, and the like which are control targets of an ECU is incorporated in the inside of the control target simulator 23.

When the microcomputer simulator 21 starts the control software, the control software transmits an instruction value to the ECU circuit simulator 22. The ECU circuit simulator 22 simulates operation of each circuit element in the ECU circuit model 221 in accordance with the instruction value. The ECU circuit simulator 22 generates a control signal as a result of the simulation, and transmits the control signal to the control target simulator 23.

The control target model 231 incorporated in the inside of the control target simulator 23 reproduces a behavior of a control target with respect to the control signal. A behavior of the control target model 231 is returned as a feedback signal to the ECU circuit simulator 22.

The ECU circuit simulator 22 applies conversion processing to a feedback signal and returns the signal to the microcomputer simulator 21. When the microcomputer simulator 21 receives the feedback signal, the control software operating on the microcomputer model 211 generates a new instruction value based on the feedback signal, and transmits the instruction value to the ECU circuit simulator 22 again. This closed loop operation is repeated during a simulation time period set by a test scenario, so that operation of the entire system is reproduced on the ECU simulation device 100.

The ECU simulator 2 not only reproduces stationary operation of the entire system, but also is usable for verification of a behavior when a fault of an element is generated on an ECU circuit. The ECU simulator 2 simulates a behavior of an ECU when a fault is generated on an ECU circuit based on a test pattern created by the test data generation section 1.

The test report generation section 3 outputs a simulation result as a report in a form usable for purposes, such as reviewing. The test report generation section 3 will be described in detail later.

Figure 2:
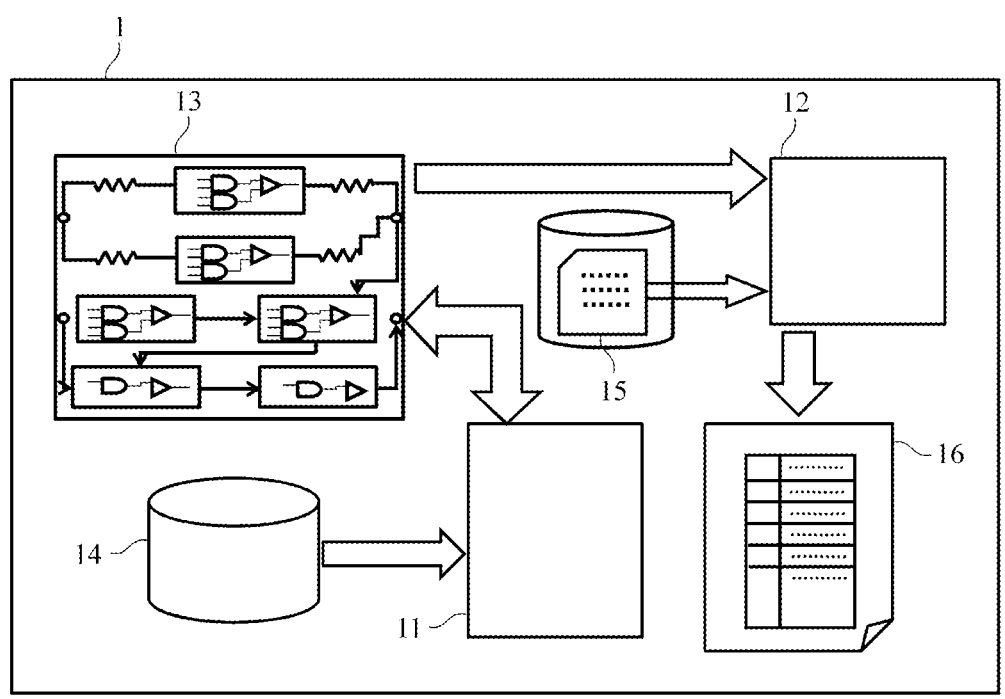
FIG. 2 is an internal configuration diagram of a test data generation section 1.

FIG. 2 is an internal configuration diagram of the test data generation section 1. The test data generation section 1 generates a test pattern 16 to be provided to the ECU simulator 2. The test data generation section 1 includes a fault mode definition section 11, a test pattern creation section 12, computer aided design (CAD) data 13, a database 14, and scenario data 15.

The CAD data 13 is an electronic diagram of a circuit included in an actual ECU. A circuit configuration described by the CAD data 13 is the same as that of the ECU circuit model 221 incorporated in the inside of the ECU circuit simulator 22. Accordingly, fault injection data for a circuit element included in an ECU is created on the basis of the CAD data 13.

The database 14 defines a fault mode for each type of a circuit element. Fault modes of a circuit element are mainly classified into short-circuit (short), open circuit (open), and an intermediate value (drift). A fault mode allocated to each type of a circuit element is defined by the international standard (IEC62380). The database 14 defines a fault mode in compliance with the standard.

The fault mode definition section 11 allocates a fault mode to each circuit element included in an ECU in accordance with a fault mode for each circuit element type defined in the database 14 so as to generate fault injection data for each circuit element. By using the fault injection data, a fault mode can be simulated comprehensively for each circuit element included in an ECU. Detailed operation of the fault mode definition section 11 will be described later.

The scenario data 15 is data that describes an item to be performed as a simulation test. When a fault that is generated on a circuit element included in an ECU, the control software is configured to output an error code corresponding to the fault. In a simulation test, when a fault is assumed to be generated on a circuit element, whether or not the control software outputs an error code as expected is tested. The scenario data 15 defines, for example, the expected error code for each circuit element and each fault mode. For example, a test practitioner can create the scenario data 15 in advance.

The test pattern creation section 12 creates the test pattern 16 to be provided to the ECU simulator 2. The test pattern 16 is data that instructs the ECU simulator 2 to simulate a fault of a circuit element and a behavior of the control software at the time of the fault after reflecting fault injection data created by the fault mode definition section 11 and the scenario data 15. Detailed operation of the test pattern creation section 12 will be described later.

Figure 3:
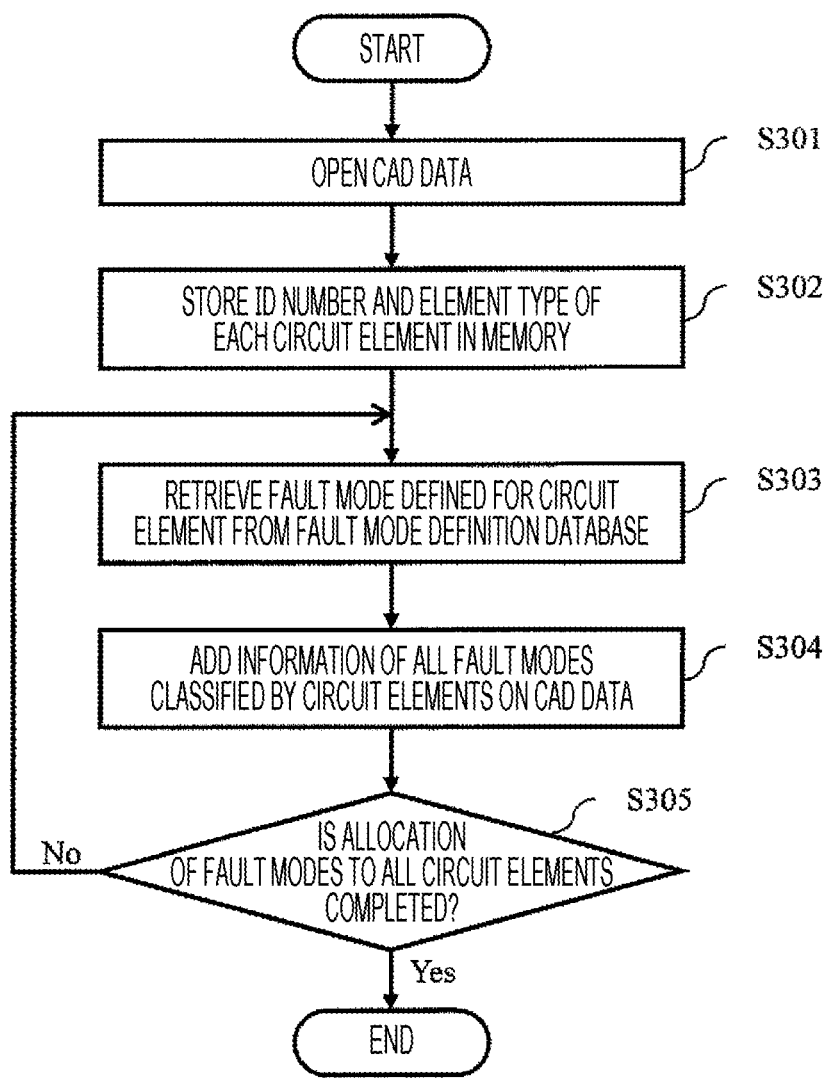
FIG. 3 is a flowchart for explaining operation of a fault mode definition section 11.

FIG. 3 is a flowchart for explaining operation of the fault mode definition section 11. Hereinafter, each step of FIG. 3 will be described.

(FIG. 3: Steps S301 to S302)

The fault mode definition section 11 opens the CAD data 13 (S301). The fault mode definition section 11 reads out an ID number of a circuit element and a type of a circuit element described in the CAD data 13, and temporarily stores them on a memory (S302). A fault mode is defined for each detailed attribute, such as a carbon-film resistor or a coil resistor, for a resistor element as an example.

(FIG. 3: Steps S303 to S305)

The fault mode definition section 11 retrieves all fault modes from the database 14 for each circuit element type described in the CAD data 13 (S303). The fault mode definition section 11 adds the fault modes acquired by retrieval to the CAD data 13 by associating them with each circuit element on the CAD data 13 (S304). The fault mode definition section 11 repeats the above operation for all circuit elements described in the CAD data 13 (S305).

(FIG. 3: Step S304: Supplementary Explanation)

In the present step, a fault mode is added to the CAD data 13 for each circuit element for the convenience of subsequent processing. In place of the above, a fault mode and a circuit element ID may be recorded in an appropriate data file other than the CAD data 13 in a manner that the fault mode and the circuit element ID are associated with each other.

Figure 4:
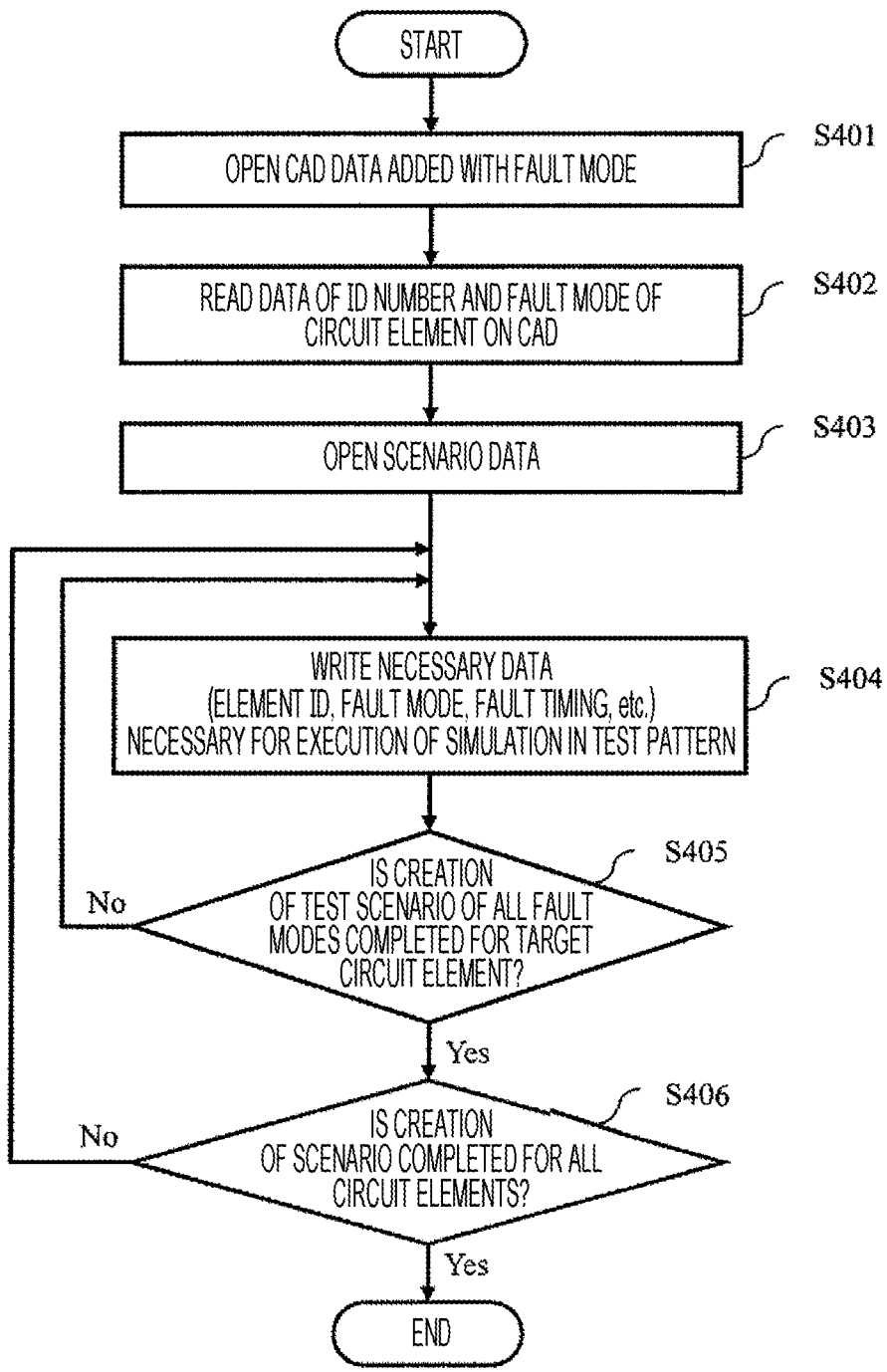
FIG. 4 is a flowchart for explaining operation of a test pattern creation section 12.

FIG. 4 is a flowchart for explaining operation of the test pattern creation section 12. Hereinafter, each step of FIG. 4 will be described.

(FIG. 4: Step S401)

The test pattern creation section 12 opens the CAD data 13 (S401). The test pattern creation section 12 reads out an ID number of each circuit element and data of all fault modes allocated to each ID from the CAD data 13 (S402).

(FIG. 4: Step S403)

The test pattern creation section 12 opens the scenario data 15 to read a test parameter. The scenario data 15 describes, for example, the following test parameters: (a) execution time of an entire test scenario; (b) a timing at which a fault is generated; (c) an error code expected to be issued by the control software at the time a fault is detected; and (d) a signal name for which a simulation log is recorded among signal names described in the CAD data 13. The test pattern creation section 12 stores the read test parameter in a memory.

(FIG. 4: Steps S404 to S406)

The test pattern creation section 12 adds all information necessary for executing a fault injection simulation to the test pattern 16 for each circuit element (which is identified by a circuit element ID) (S404). The test pattern creation section 12 repeats the present step until all fault modes allocated to each circuit element are covered (S405). The test pattern creation section 12 further repeats similar processing to all circuit elements on the CAD data 13 (S406).

Figure 5:
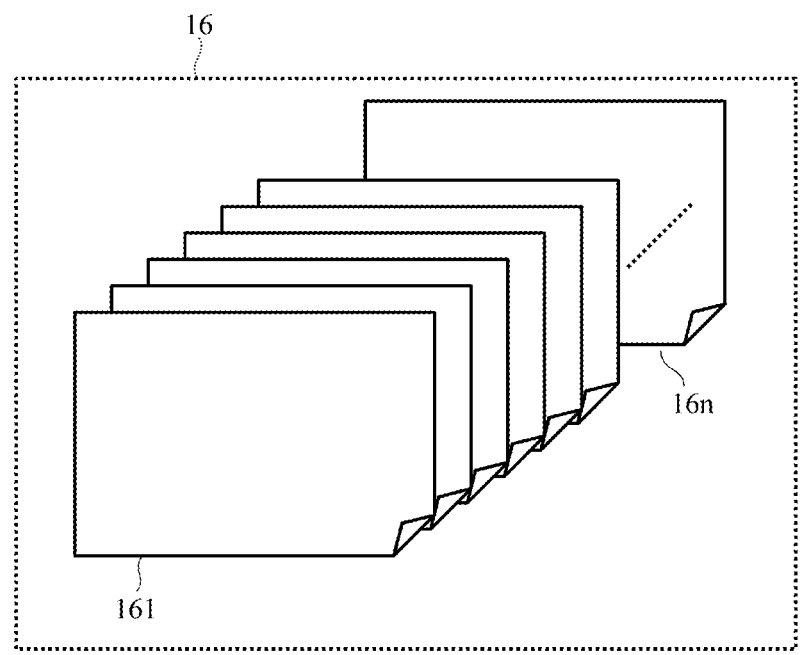
FIG. 5 is an image diagram of a test pattern 16.

FIG. 5 is an image diagram of the test pattern 16. The test pattern 16 can be configured as a file group including files 161 to 16n covering fault modes for each circuit element. The scenario data 15 may be replaced when test parameters, such as execution time of an entire test scenario, a timing at which a fault is generated, and a signal name for which a log is recorded, need to be changed. Definition of a fault mode is not changed unless definition of the international standard is changed. Accordingly, even when the scenario data 15 is replaced, a fault mode added to the CAD data 13 does not need to be changed.

The ECU simulator 2 receives the test pattern 16 generated by the test data generation section 1. The ECU simulator 2 sequentially executes fault injection simulations described in the files 161 to 16n. The ECU simulator 2 outputs a log for a signal designated for recording of a simulation log during the execution of each fault injection simulation.

Figure 6:
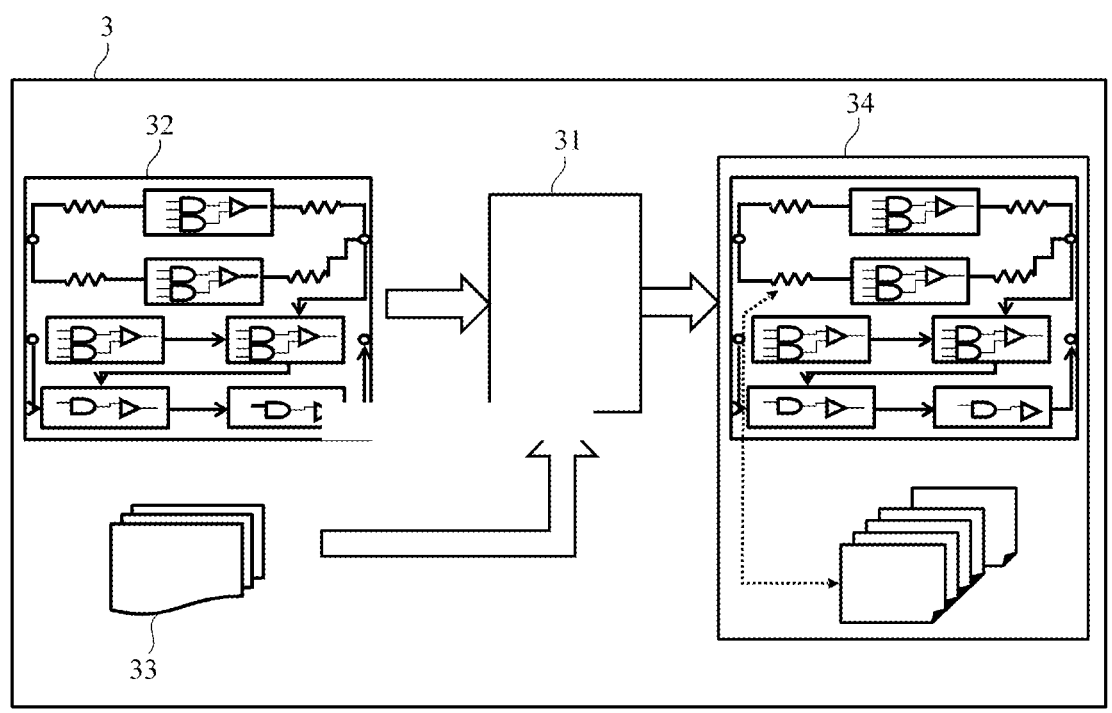
FIG. 6 is an internal configuration diagram of a test report generation section 3.

FIG. 6 is an internal configuration diagram of the test report generation section 3. The test report generation section 3 organizes results of fault injection simulations as a report file based on log data output from the ECU simulator 2. CAD data 32 describes the same content as that of the CAD data 13 (to which a fault mode is added). The report creation section 31 creates a test report 34 to be used for a test result report and a review by using a simulation log file group 33 output by the ECU simulator 2 and the CAD data 32.

Figure 7:
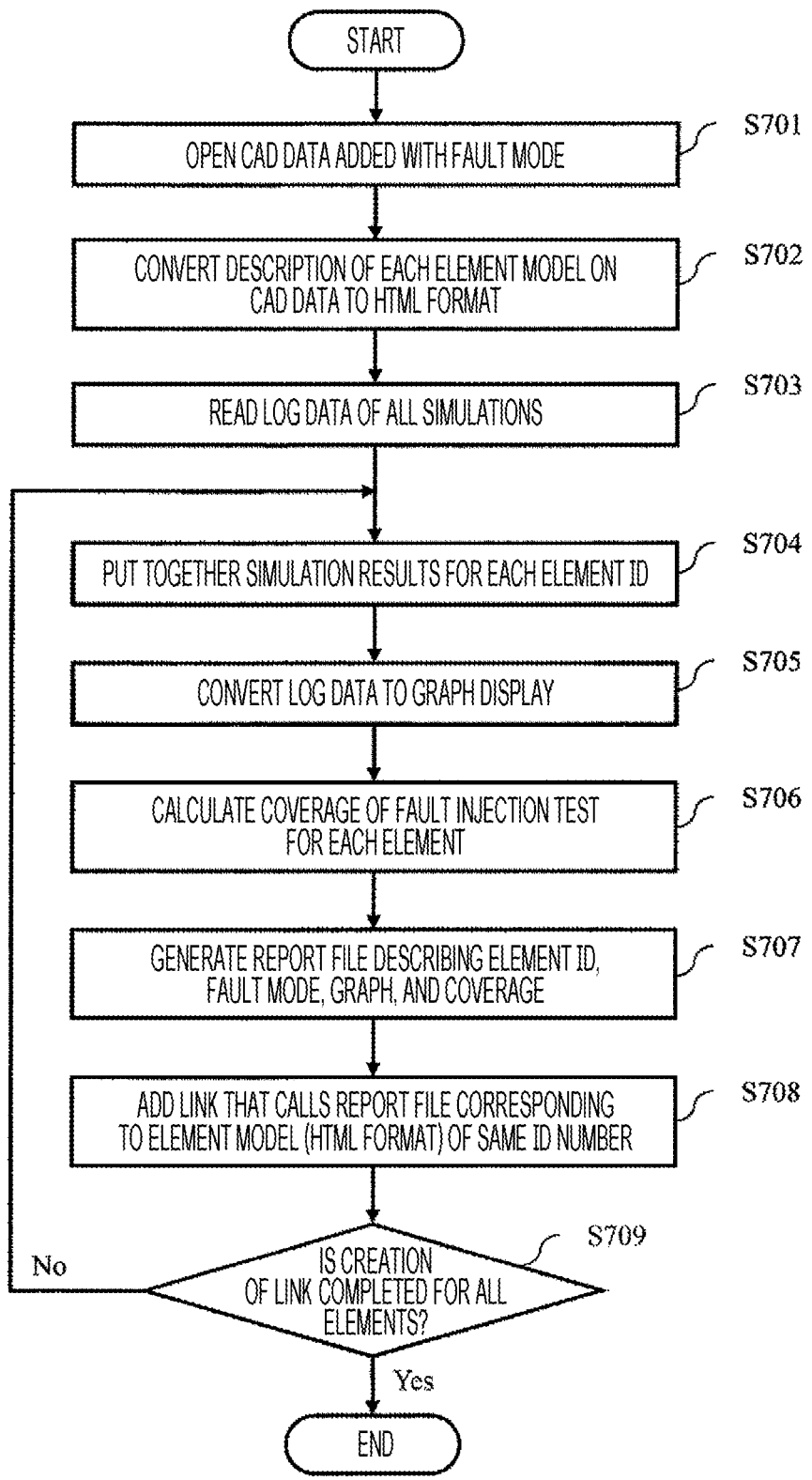
FIG. 7 is a flowchart for explaining operation of a report creation section 31.

FIG. 7 is a flowchart for explaining operation of the report creation section 31. Hereinafter, each step of FIG. 7 will be described.

(FIG. 7: Steps S701 to S703)

The report creation section 31 opens the CAD data 32 (S701). The report creation section 31 batch converts circuit elements and their arrangement described in the CAD data 32 to a file in an HTML format (S702). The report creation section 31 opens the simulation log file group 33 (S703).

(FIG. 7: Steps S704 to S705)

The report creation section 31 extracts simulation results with respect to one circuit element (an individual circuit element is identified by a circuit element ID) described in the CAD data 32 from the simulation log file group 33, and puts them together (S704). The report creation section 31 converts the extracted log data to graph display, so as to visualize a change in a signal with respect to an elapsed time period of the simulation (S705).

(FIG. 7: Step S706)

The report creation section 31 calculates test coverage for each circuit element. The test coverage used here is the proportion of the number of items for which the control software outputs an error code as expected to the number of tests performed for each circuit element. That is, the test coverage used here shows the proportion of successful test results. The expected error code is one that is described in the scenario data 15, and content of the error code is passed to the test pattern 16 as well.

(FIG. 7: Step S707)

The report creation section 31 creates a test report that describes a circuit element ID, a fault mode, the graph (which is created in S705), the test coverage (which is calculated in S706), and the like.

(FIG. 7: Step S708)

The report creation section 31 adds a link to the CAD data 32 to the test report. This makes it easy to trace which circuit element on an ECU is referred to by each item of the test report. More preferably, a link to a specific circuit element described in the CAD data 32 is generated. For example, a link to a specific tag on HTML data equivalent to the CAD data 32 generated in Step S702 is generated, so that similar processing can be performed. Alternatively, the configuration may be such that CAD data in an HTML format is generated for each circuit element in Step S702, and a link to the CAD data for each circuit element is added in the present step.

(FIG. 7: Step S709)

The report creation section 31 repeats Steps S704 to S708 for all circuit elements described in the CAD data 32. As a result, the test report 34, with which a fault injection simulation result covering fault modes for each circuit element is associated, is created.

Figure 8:
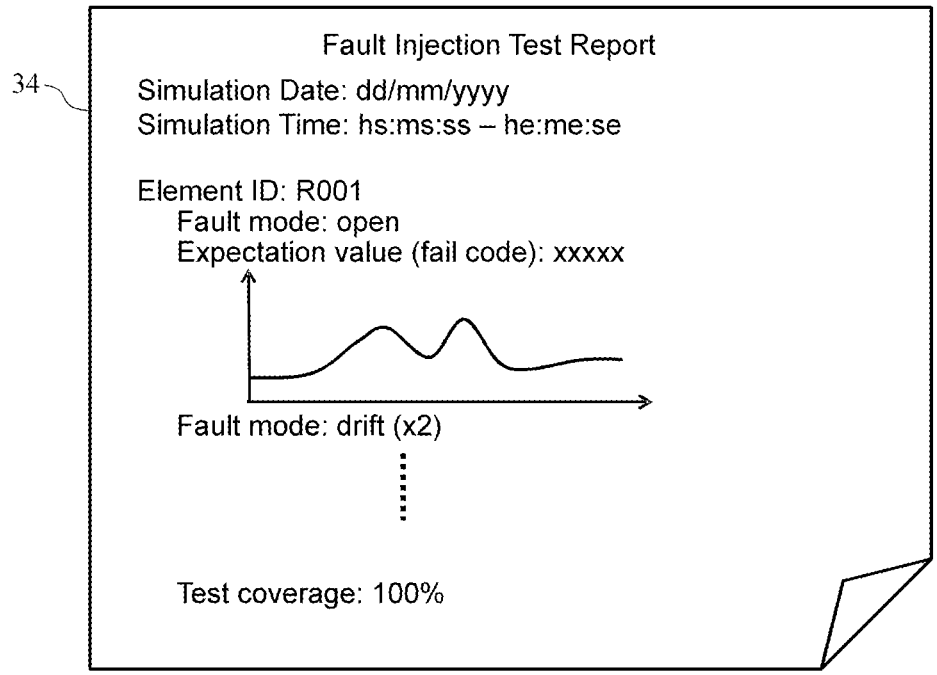
FIG. 8 shows an example of a test report 34.

FIG. 8 shows an example of the test report 34. The circuit element ID, the fault mode, the graph, the test coverage, and the like mentioned above are described for each circuit element. A person in charge of a test can easily trace a test result by associating a simulation test result with the CAD data 32 based on the test report 34.

First Embodiment: Summary

The ECU simulation device 100 according to the first embodiment automatically generates the test pattern 16 in accordance with a fault mode of each circuit element type defined by the database 14. In this manner, a series of operations from generation of fault injection data to generation of the test report 34 can be automatically executed without the need of operation performed by a person in charge of a test. In particular, operation time of a step of creating the test pattern 16 and a step of creating the test report 34 (including a simulation log analyzing operation) can be significantly shortened. As a result, quality that is equal to or higher than that of a conventional configuration can be obtained even with a short development period.

Second Embodiment

Figure 9:
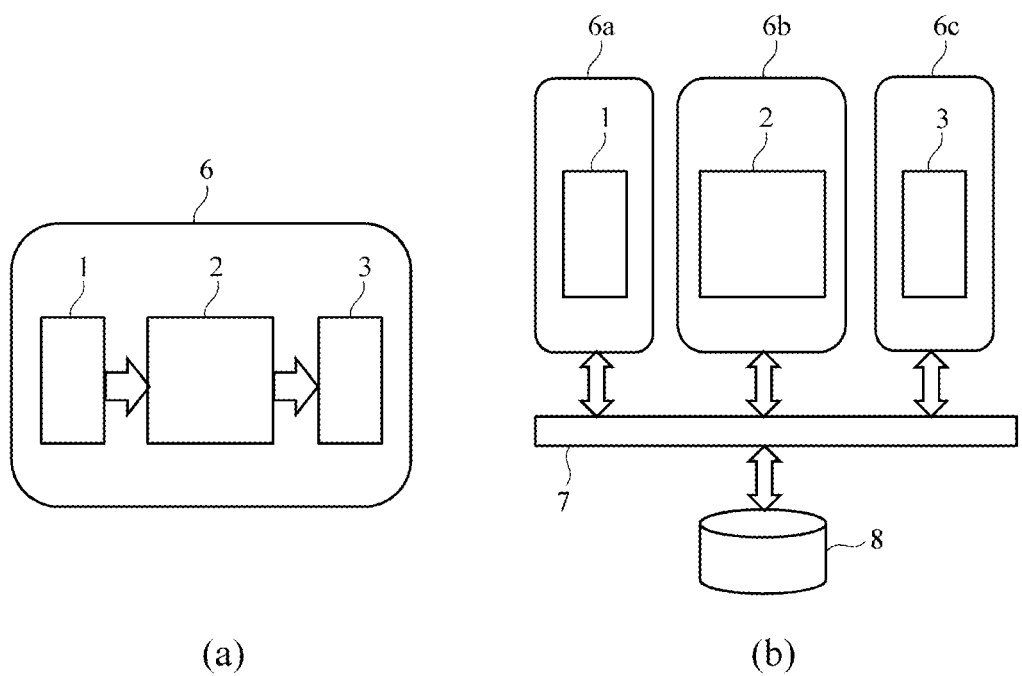
FIG. 9 is a diagram showing a configuration example of a computer mounted with the ECU simulation device 100.

FIG. 9 is a diagram showing a configuration example of a computer mounted with the ECU simulation device 100. FIG. 9(a) is an example in which the ECU simulation device 100 is configured on a single computer 6. FIG. 9(b) is an example in which the ECU simulation device 100 is configured on three computers 6a to 6c in a distributed manner.

In FIG. 9(a), the test data generation section 1, the ECU simulator 2, and the test report generation section 3 are configured on the single computer 6. For example, a desktop personal computer can be used as the computer 6. For this reason, there is an advantage that simulation can be performed in a comparatively small area.

In FIG. 9(b), the test data generation section 1, the ECU simulator 2, and the test report generation section 3 are disposed separately on a plurality of the computers 6a, 6b, and 6c connected over a network. The computers 6a, 6b, and 6c are connected by a local area network (LAN) 7, and perform the simulation described in the first embodiment by intercommunication through the LAN 7. An external storage device 8 is, for example, a network attached storage (NAS), and shared-accessed by the test data generation section 1, the ECU simulator 2, and the test report generation section 3, each of which inputs and outputs data.

Since the configuration of FIG. 9(b) includes connection over a network, there is no physical restriction on an arranging location of the computers 6a to 6c. For example, when the ECU simulator 2 on the computer 6b is built on a cloud environment, and the microcomputer simulator 21, the ECU circuit simulator 22, and the control target simulator 23 are arranged on separate virtual machines (VMs), a calculation load of execution of a simulation can be distributed. In this manner, a time period of a simulation execution process can be expected to be shortened.

<Variations of Present Invention>

The present invention is not limited to the above embodiments and includes a variety of variations. For example, the above embodiments are described in detail for easy understanding of the present invention, and the present invention is not necessarily limited to embodiments that include all the described configurations. Part of a configuration of a certain embodiment can be replaced with a configuration of another embodiment, and a configuration of a certain embodiment can be added to a configuration of another embodiment. For part of a configuration of each embodiment, other configurations may be added, deleted, or replaced with.

Part of the above configurations, functions, processing sections, processing means, and the like may be obtained as hardware by way of, for example, designing such part as an integrated circuit. The above configurations, functions, and the like may be obtained by software by which a processor interprets and executes programs that perform functions of them. Information, such as a program that performs each function, a table, and a file, can be stored in recording devices, such as a memory, a hard disk, and a solid state drive (SSD), and recording media, such as an IC card, an SD card, and a DVD.

REFERENCE SIGNS LIST

100 ECU simulation device
1 test data generation section
2 ECU simulator
3 test report generation section

The invention claimed is:

1. An electronic control unit ("ECU") simulation device that simulates operation of an ECU, the ECU simulation device comprising:
   a test data generation section that generates test data;
   an ECU simulator that simulates the operation of the ECU by using the test data; and
   a report generation section that generates a report of a result of a simulation performed by the ECU simulator, wherein
   the test data generation section includes a database defining one or more fault modes corresponding to each type of a circuit element,
   the test data generation section reads a type of the circuit element included in the ECU from computer aided design ("CAD") data describing a circuit design of the ECU and obtains the fault modes corresponding to the read type from the database, so as to generate a test pattern that simulates the operation of the ECU based on an assumption that the fault modes are generated for each circuit element included in the ECU, and
   the ECU simulator simulates the operation of the ECU by using the test pattern for each circuit element of the ECU generated by the test data generation section.

2. The ECU simulation device according to claim 1, further comprising:
   a storage device that stores scenario data describing a parameter used by the ECU simulator for simulating the operation of the ECU, wherein
   the ECU simulator is configured to simulate the operation of the ECU by executing control software configured to output an error code corresponding to the fault mode,
   the scenario data describes an error code that is expected to be output by the control software when a fault corresponding to the fault mode occurs in the circuit element included in the ECU, and
   the ECU simulator simulates, for each circuit element included in the ECU, whether or not the control software outputs the error code described in the scenario data as the error code corresponding to the fault mode.

3. The ECU simulation device according to claim 2, wherein
   the report generation section outputs, as a cover rate of a simulation performed by the ECU simulator, a ratio between the number of simulations performed by the ECU simulator for each circuit element included in the ECU and the number of error codes that are described in the scenario data and output by the control software as the error codes corresponding to the fault mode.

4. The ECU simulation device according to claim 1, wherein the report generation section generates hypertext markup language ("HTML") CAD data obtained by converting the CAD data to an HTML format and also generates the report in an HTML format, and
   the report includes a link to the HTML CAD data.

5. The ECU simulation device according to claim 4, wherein
   the report generation section associates the circuit element of the ECU described in the HTML CAD data with a result of the simulation performed for each circuit element of the ECU by the ECU simulator by an HTML link.

6. The ECU simulation device according to claim 1, wherein
   all of the test data generation section, the ECU simulator, and the report generation section are disposed on the same computer, or disposed on two or more computers interconnected over a network in a distributed manner.

\* \* \* \* \*